(12) United States Patent
Horita et al.

(10) Patent No.: US 8,641,829 B2
(45) Date of Patent: Feb. 4, 2014

(54) SUBSTRATE PROCESSING SYSTEM (71) Applicant: Hitachi Kokusai Electric Inc., Tokyo (JP)

(72) Inventors: Tomoki Horita, Toyama (JP); Kazuhiro Hirahara, Joetsu (JP); Hironobu Miya, Toyama (JP); Atsuhiko Suda, Toyama (JP); Hirohisa Yamazaki, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 13/942,396

(22) Filed: Jul. 15, 2013

(65) Prior Publication Data

US 2013/0298947 A1 Nov. 14, 2013

Related U.S. Application Data (62) Division of application No. 11/990,499, filed as application No. PCT/JP2007/051038 on Jan. 24, 2007, now Pat. No. 8,506,714.

(30) Foreign Application Priority Data

Jan. 24, 2006 (JP) ................................ 2006-015295
Sep. 21, 2006 (JP) ................................ 2006-255635

(51) Int. Cl.
| | | |
|---|---|---|
| *B08B 3/00* | (2006.01) | |
| *C03C 23/00* | (2006.01) | |
| *C23G 1/00* | (2006.01) | |
| *C23G 1/02* | (2006.01) | |
| *B44C 1/22* | (2006.01) | |
| *C03C 15/00* | (2006.01) | |
| *C03C 25/68* | (2006.01) | |
| *C23C 16/50* | (2006.01) | |
| *C23C 16/00* | (2006.01) | |

(52) U.S. Cl.
USPC .......... 134/28; 134/2; 134/3; 134/26; 134/27; 134/29; 216/103; 216/106; 216/108; 118/723 VE (58) Field of Classification Search
USPC .............. 134/2, 3, 26–29; 216/103, 106, 108; 118/723 VE
See application file for complete search history.

(56) References Cited

U.S. PATENT DOCUMENTS 5,362,328 A * 11/1994 Gardiner et al. ............... 118/726
5,372,754 A * 12/1994 Ono .............................. 261/142

(Continued)

FOREIGN PATENT DOCUMENTS

JP 11012740 A * 1/1999
JP 11229149 A * 8/1999

(Continued)

OTHER PUBLICATIONS

Japanese Office Action (with full English language translation), dated Jun. 5, 2012, issued in corresponding JP Patent Application No. 2006-255635.

*Primary Examiner* — Rudy Zervigon (74) *Attorney, Agent, or Firm* — Birch, Stewart, Kolasch & Birch, LLP (57) ABSTRACT

Disclosed is a substrate processing system, including:
a processing chamber to process a substrate; a vaporizing unit to vaporize a material of liquid; a supply system to supply the processing chamber with gas of the material vaporized by the vaporizing unit; an exhaust system to exhaust an atmosphere in the processing chamber; and a cleaning liquid supply system to supply the vaporizing unit with cleaning liquid for cleaning a product deposited in the vaporizing unit, wherein the cleaning liquid supply system supplies at least two kinds of cleaning liquids into the vaporizing unit so that the product can be removed from the vaporizing unit by action of the two kinds of cleaning liquids on the product.

3 Claims, 8 Drawing Sheets

(56) References Cited

U.S. PATENT DOCUMENTS

| | | | |
|---|---|---|---|
| 5,376,409 A * | 12/1994 | Kaloyeros et al. | 427/248.1 |
| 5,648,114 A * | 7/1997 | Paz De Araujo et al. | 427/126.3 |
| 5,690,743 A * | 11/1997 | Murakami et al. | 118/715 |
| 5,776,254 A * | 7/1998 | Yuuki et al. | 118/725 |
| 5,863,348 A * | 1/1999 | Smith et al. | 134/18 |
| 5,876,503 A * | 3/1999 | Roeder et al. | 118/715 |
| 5,882,416 A * | 3/1999 | Van Buskirk et al. | 118/726 |
| 5,954,911 A * | 9/1999 | Bergman et al. | 156/345.29 |
| 5,964,230 A * | 10/1999 | Voloshin et al. | 134/98.1 |
| 6,037,001 A * | 3/2000 | Kaloyeros et al. | 427/250 |
| 6,110,531 A * | 8/2000 | Paz de Araujo et al. | 427/255.25 |
| 6,178,925 B1 * | 1/2001 | Sturm et al. | 122/390 |
| 6,216,708 B1 * | 4/2001 | Agarwal | 134/1.1 |
| 6,258,171 B1 * | 7/2001 | Agarwal | 118/715 |
| 6,271,498 B1 * | 8/2001 | Miyake et al. | 219/121.43 |
| 6,296,711 B1 * | 10/2001 | Loan et al. | 118/726 |
| 6,454,860 B2 * | 9/2002 | Metzner et al. | 118/715 |
| 6,511,718 B1 * | 1/2003 | Paz de Araujo et al. | 427/576 |
| 6,534,133 B1 * | 3/2003 | Kaloyeros et al. | 427/576 |
| 6,581,625 B1 * | 6/2003 | Arai et al. | 137/240 |
| 6,756,318 B2 * | 6/2004 | Nguyen et al. | 438/758 |
| 7,105,055 B2 * | 9/2006 | Ferro et al. | 117/84 |
| 7,108,748 B2 * | 9/2006 | Brabant et al. | 117/88 |
| 7,112,538 B2 * | 9/2006 | Ferro et al. | 438/763 |
| 7,367,350 B2 * | 5/2008 | Toriya et al. | 137/15.04 |
| 7,393,561 B2 * | 7/2008 | Paranjpe | 427/248.1 |
| 7,442,615 B2 * | 10/2008 | Nguyen et al. | 438/308 |
| 7,452,424 B2 * | 11/2008 | Okabe et al. | 118/726 |
| 7,462,239 B2 * | 12/2008 | Brabant et al. | 117/86 |
| 7,867,905 B2 * | 1/2011 | Nguyen et al. | 438/680 |
| 8,026,159 B2 * | 9/2011 | Horii et al. | 438/500 |
| 8,197,600 B2 * | 6/2012 | Nakao et al. | 118/726 |
| 8,225,745 B2 * | 7/2012 | Marsh et al. | 118/723 VE |
| 8,382,903 B2 * | 2/2013 | Okabe et al. | 118/726 |
| 2003/0049375 A1 * | 3/2003 | Nguyen et al. | 427/255.28 |
| 2003/0134038 A1 * | 7/2003 | Paranjpe | 427/248.1 |
| 2003/0140965 A1 * | 7/2003 | Arai et al. | 137/240 |
| 2004/0156996 A1 * | 8/2004 | Takeshita et al. | 427/377 |
| 2004/0187777 A1 * | 9/2004 | Okamoto et al. | 118/715 |
| 2005/0087135 A1 * | 4/2005 | Hioki et al. | 118/715 |
| 2006/0065254 A1 * | 3/2006 | Okabe et al. | 123/557 |
| 2006/0104884 A1 * | 5/2006 | Shaffer et al. | 423/445 R |
| 2006/0270222 A1 * | 11/2006 | Yamoto | 438/681 |
| 2007/0079760 A1 * | 4/2007 | Okabe et al. | 118/715 |
| 2007/0251451 A1 * | 11/2007 | Nguyen et al. | 118/715 |
| 2008/0245306 A1 * | 10/2008 | Nakao et al. | 118/726 |
| 2008/0286075 A1 * | 11/2008 | Horii | 414/147 |
| 2009/0061648 A1 * | 3/2009 | Horii et al. | 438/778 |
| 2010/0285237 A1 * | 11/2010 | Ditizio et al. | 427/569 |
| 2011/0300695 A1 * | 12/2011 | Horii et al. | 438/507 |
| 2012/0202353 A1 * | 8/2012 | Ditizio et al. | 438/761 |

FOREIGN PATENT DOCUMENTS

| | | | |
|---|---|---|---|
| JP | 11-288926 A | | 10/1999 |
| JP | 2000-248363 | | 9/2000 |
| JP | 2000248363 A | * | 9/2000 |
| JP | 2003-282449 A | | 10/2003 |
| JP | 2005-327864 A | | 11/2005 |

* cited by examiner

| OPEN | ○ |
|---|---|
| CLOSE | × |

VALVE No.

| No. | NAME OF STEP | 1 | 2 | 3 | 4 | 5 | 6 | 7 | 8 | 9 | 10 | 11 |
|---|---|---|---|---|---|---|---|---|---|---|---|---|
| 1 | START | × | × | × | × | × | × | × | × | × | × | × |
| 2 | REMOVE LIQUID MATERIAL | × | × | × | × | × | × | × | × | × | ○ | × |
| 3 | PURGE | × | × | × | × | × | × | × | × | × | ○ | ○ |
| 4 | VACUUM | × | ○ | × | × | × | × | × | × | × | ○ | × |
| 5 | INTRODUCE CLEANING LIQUID A | × | × | × | × | ○ | × | × | × | × | × | × |
| 6 | PURGE | ○ | × | × | × | × | ○ | × | × | × | × | ○ |
| 7 | INTRODUCE CLEANING LIQUID B | × | × | × | × | × | × | ○ | × | × | × | × |
| 8 | PURGE | × | × | × | × | × | × | × | × | × | × | ○ |
| 9 | VACUUM | × | × | × | × | × | × | × | × | × | ○ | × |
| 10 | END | × | × | × | × | × | × | × | × | × | × | × |

Metal Precursor Dose:

Water Dose:

SUBSTRATE PROCESSING SYSTEM

This application is a Divisional of co-pending application Ser. No. 11/990,499 filed on Feb. 15, 2008, and for which priority is claimed under 35 U.S.C. §120; which claims priority from PCT/JP2007/051038 filed in Japan on Jan. 24, 2007; which claims priority under 35 U.S.C. §119 of Application No. 2006-015295 filed in Japan on Jan. 24, 2006 and Application No. 2006-255635 filed in Japan on Sep. 21, 2006; the entire contents of all these applications being hereby incorporated by reference.

BACKGROUND OF THE INVENTION

The present invention relates to a substrate processing apparatus and a substrate processing system having a supply device for a liquid material connected to the substrate processing apparatus, and more particularly, to a vaporizing unit for vaporizing a liquid material or a cleaning system for a liquid material supply device having the vaporizing unit.

DESCRIPTION OF THE RELATED ART

When a high-permittivity film such as $HfO_2$ and $ZrO_2$ is formed, a material which is liquid at room temperature and atmospheric pressure is mainly used. When a liquid material is supplied to a reaction chamber, it is necessary to vaporize the liquid material using a vaporizer.

As the vaporizer, there is a method for bubbling using an inert gas to supply, and a method for heating and vaporizing to supply. The method for heating and vaporizing is more widely used recently because a greater supply amount can be secured.

Figure 1:
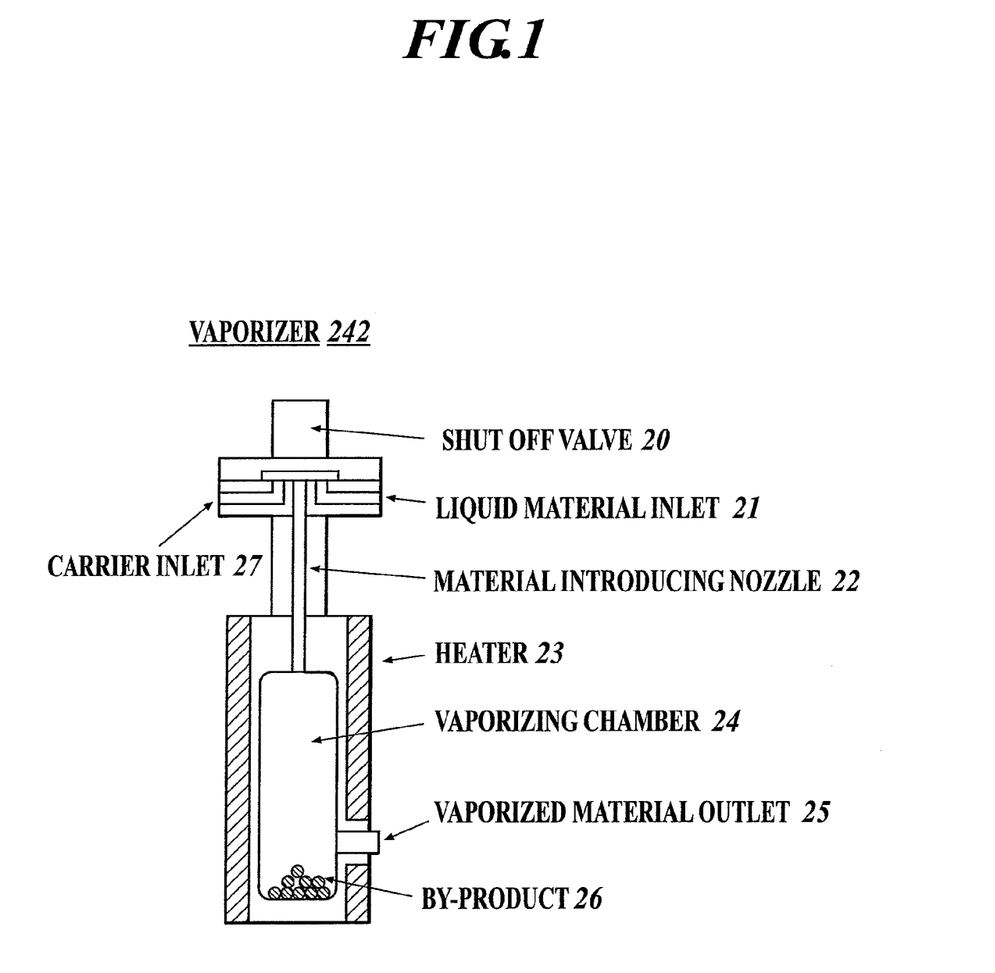
FIG. 1 is a schematic configuration diagram of a vaporizer used in a substrate processing system according to embodiments of the present invention.

FIG. 1 shows a schematic configuration of a heating and vaporizing type vaporizer 242. A liquid material supplied by a liquid material inlet 21 is mixed with a carrier (an inert gas such as $N_2$) supplied from a carrier inlet 27. Then, the liquid material passes through a material introducing pipe 22 and is vaporized in a vaporizing chamber 24 heated by a heater 23, and is sent into a reaction chamber through a vaporized material outlet 25.

Among materials which can be used, TEMAH (Hf(NEtMe)$_4$) has high reactivity with moisture, thereby reacts with moisture included in a carrier $N_2$. This facilitates the creation of a by-product 26, and may cause clogging of a pipe or may cause particles. There are many liquid materials which have extremely high reactivity with moisture or which are easily autolyzed when heated.

Due to such factors, a portion of the liquid material is decomposed in the vaporizing unit and various problems may occur owing to such decomposed matters in some cases. When the boiling point of the decomposed matter (by-product) due to moisture or heat is higher than the boiling point of the original liquid material, the decomposed matter is not vaporized in the vaporizing unit, becomes liquid or solid, and is deposited in the vaporizing unit.

The residual material becomes a generation source of dust, or adheres to a surface of an inner wall of the vaporizing unit, lowers the temperature of the vaporizer to deteriorate the vaporizing performance, or narrows a flow passage to hinder the gas flow. Therefore, it is necessary to overhaul the vaporizing unit within a short period.

Figure 8:
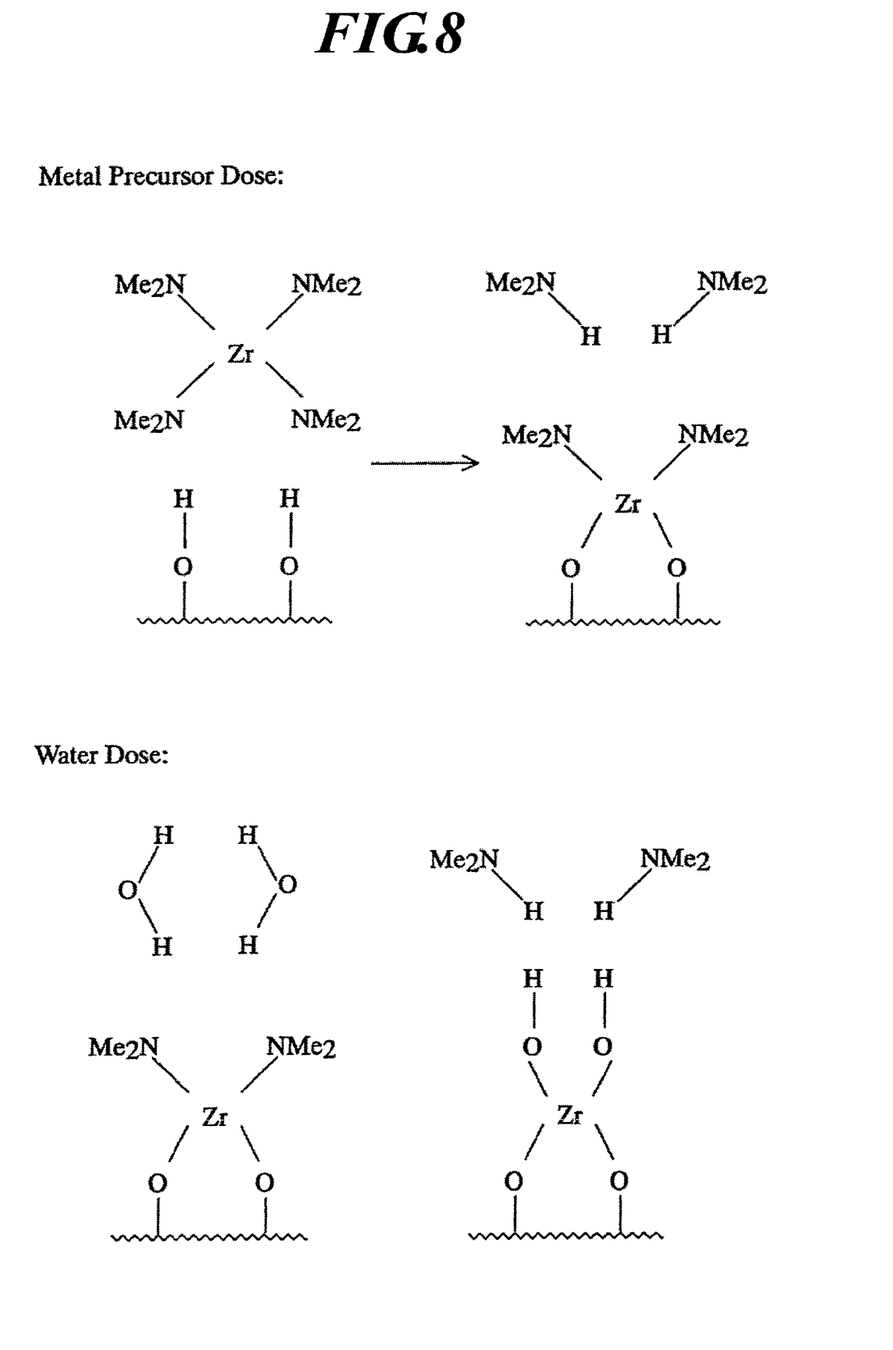
FIG. 8 is an explanatory diagram for adhesion of a raw material and film formation in an ALD film formation.

FIG. 8 shows a reaction mechanism when a film is formed by an ALD method (reference: D. M. Hausmann, E. Kim, J. Becker and R. G. Gordon, Chem. Matter 14 (2002) 4350-4358). For example, when a material is $Zr(NMe_2)_4$, first, the $Zr(NMe_2)_4$ is adsorbed in Si—OH on a substrate and $Me_2N$—H is separated. Then, when $H_2O$ is used as oxidizer, $Me_2N$— which is attached to Zr is separated as $Me_2N$—H by substitution reaction with $H_2O$ and Zr—OH is formed. If $H_2O$ is included in a carrier gas, since $Zr(NMe_2)_4$ and $H_2O$ exist at the same time, a cluster such as $(NMe_2)_n(OH)_mZrO_1$ is formed and this causes particles.

SUMMARY OF THE INVENTION

It is, therefore, a main object of the present invention to discharge deposited materials outside a vaporizing unit without detaching the vaporizing unit from a pipe before a large amount of deposited materials are accumulated in the vaporizing unit. That is, it is a main object of the present invention to provide a substrate processing system capable of preventing particles (dust) from increasing, and extending a maintenance interval of piping, a valve and the like by removing a by-product generated by decomposition of raw material.

According to one aspect of the present invention, there is provided a substrate processing system, comprising:
a processing chamber to process a substrate;
a vaporizing unit to vaporize a material of liquid;
a supply system to supply the processing chamber with gas of the material vaporized by the vaporizing unit;
an exhaust system to exhaust an atmosphere in the processing chamber; and
a cleaning liquid supply system to supply the vaporizing unit with cleaning liquid for cleaning a product deposited in the vaporizing unit, wherein
the cleaning liquid supply system supplies at least two kinds of cleaning liquids into the vaporizing unit so that the product can be removed from the vaporizing unit by action of the two kinds of cleaning liquids on the product.

DESCRIPTION OF THE PREFERRED EMBODIMENTS

Preferred embodiments of the present invention will be explained with reference to the drawings.

Figure 4:
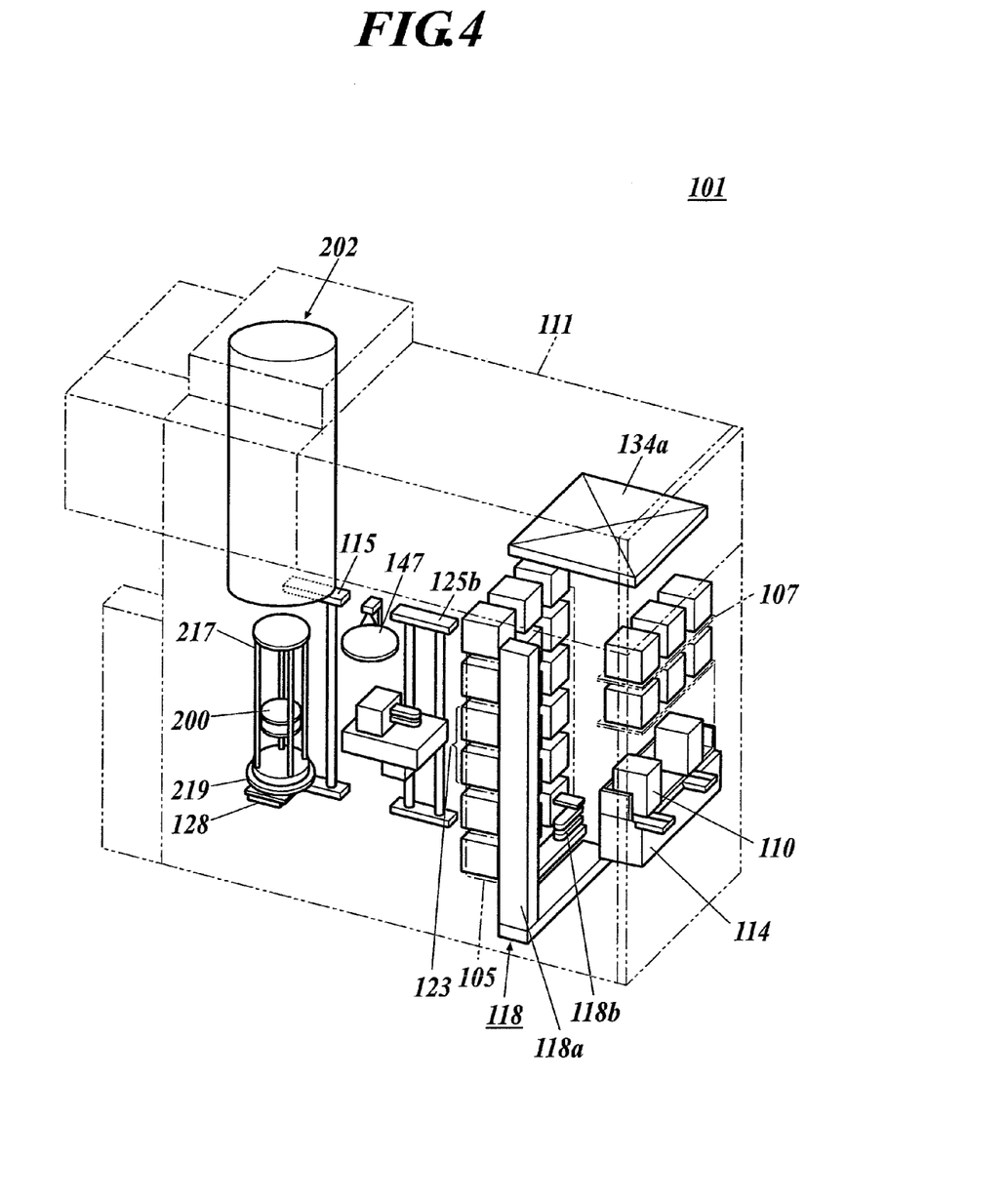
FIG. 4 is a schematic perspective view of a substrate processing apparatus used in the substrate processing system according to the embodiments of the present invention.
Figure 5:
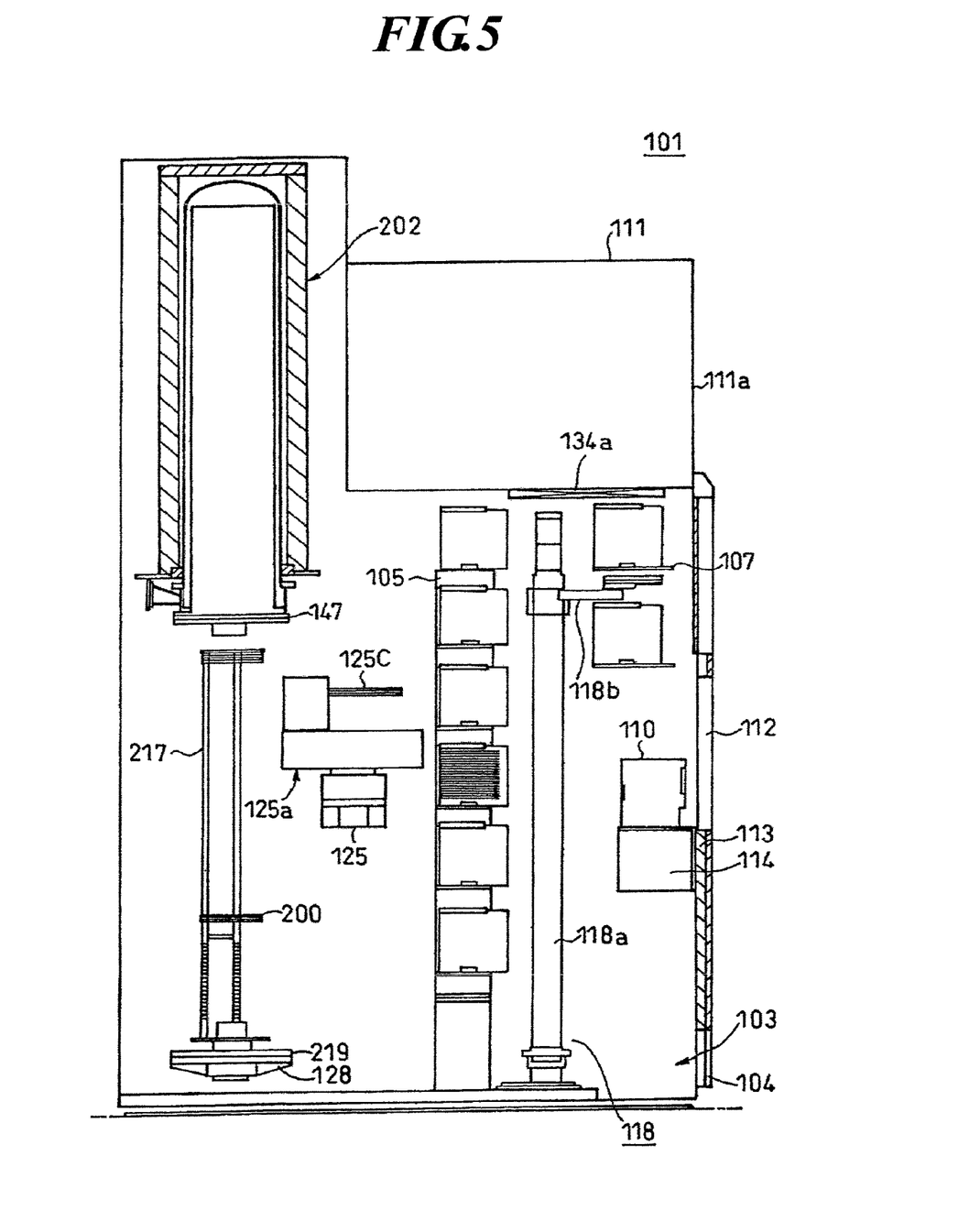
FIG. 5 is a schematic side perspective view of the substrate processing apparatus used in the substrate processing system according to the embodiments of the present invention.

First, a substrate processing apparatus used in a substrate processing system which carries out processing steps in a producing method of a semiconductor device will be explained with reference to FIGS. 4 and 5. In the following explanation, a case in which a semiconductor producing apparatus (simply, processing apparatus, hereinafter) which subjects a substrate to oxidation processing, diffusion processing, CVD processing and the like is used as a substrate processing apparatus will be described. FIG. 4 is a perspective view of the processing apparatus used in the embodiments of the present invention. FIG. 5 is a side perspective view of the processing apparatus shown in FIG. 4.

As shown in FIGS. 4 and 5, a processing apparatus 101 of the preferred embodiment uses cassettes 110 as wafer carriers which accommodate wafers (substrates) 200 made of silicon. The processing apparatus 101 includes a casing 111 having a front wall 111a. A front maintenance opening 103 as an opening is formed at a lower portion of the front wall 111a so that maintenance can be carried out. A front maintenance door 104 is provided for opening and closing the front maintenance opening 103. A cassette carry in/out opening (a substrate container carry in/out opening) 112 is formed at the maintenance door 104 so that an inside and an outside of the casing 111 are in communication through the cassette carry in/out opening 112. The cassette carry in/out opening 112 is opened and closed by a front shutter (substrate container carry in/out opening open/close mechanism) 113. A cassette stage (a substrate container delivery stage) 114 is disposed at the cassette carry in/out opening 112 inside the casing 111. The cassette 110 is transferred onto the cassette stage 114 by a rail guided vehicle (not shown) and carried out from the cassette stage 114.

The cassette 110 delivered by the rail guided vehicle is placed on the cassette stage 114 such that the wafers 200 in the cassette 110 are in their vertical attitudes and an opening of the cassette 110 for taking wafers in and out is directed upward. The cassette stage 114 is constituted such that it rotates the cassette 110 clockwisely in the vertical direction by 90° to rearward of the casing, the wafers 200 in the cassette 110 are in their horizontal attitudes, and the opening of the cassette 110 for taking wafers in and out is directed to rearward of the casing.

Cassette shelves (substrate container placing shelves) 105 are disposed substantially at a central portion in the casing 111 in its longitudinal direction, and the cassette shelves 105 store a plurality of cassettes 110 in a plurality of rows and a plurality of lines. The cassette shelves 105 are provided with transfer shelves 123 in which the cassettes 110 to be transferred by a wafer loading mechanism 125 are to be accommodated. Auxiliary cassette shelves 107 are provided above the cassette stage 114 to subsidiarily store the cassettes 110.

A cassette transfer device (a substrate container transfer device) 118 is provided between the cassette stage 114 and the cassette shelves 105. The cassette transfer device 118 includes a cassette elevator (a substrate container elevator mechanism) 118a capable of vertically moving while holding the cassette 110, and a cassette transfer mechanism (a substrate container transfer mechanism) 118b as a transfer mechanism. The cassette transfer device 118 transfers the cassette 110 between the cassette stage 114, the cassette shelves 105 and the auxiliary cassette shelves 107 by a continuous motion of the cassette elevator 118a and the cassette transfer mechanism 118b.

A wafer loading mechanism (a substrate transfer mechanism) 125 is provided behind the cassette shelves 105. The wafer loading mechanism 125 includes a wafer loading device (a substrate loading device) 125a which can rotate or straightly move the wafer 200 in the horizontal direction, and a wafer loading device elevator (a substrate loading device elevator mechanism) 125b which vertically moves the wafer loading device 125a. The wafer loading device elevator 125b is provided on a right end of the pressure-proof casing 111. Tweezers (a substrate holding body) 125c of the wafer loading device 125a as a placing portion of the wafers 200 charges a boat (a substrate holding tool) 217 with wafers 200 and discharges the wafers 200 from the boat 217 by continuous motion of the wafer loading device elevator 125b and the wafer loading device 125a.

As shown in FIG. 5, a processing furnace 202 is provided at a rear upper portion in the casing 111. A lower end of the processing furnace 202 is opened and closed by a furnace opening shutter (a furnace opening open/close mechanism) 147.

A boat elevator (a substrate holding tool elevator mechanism) 115 is provided below the processing furnace 202 as an elevator mechanism for vertically moving the boat 217 to and from the processing furnace 202. A seal cap 219 as a lid is horizontally set up on an arm 128 as a connecting tool connected to an elevating stage of the boat elevator 115. The seal cap 219 vertically supports the boat 217, and can close a lower end of the processing furnace 202.

The boat 217 includes a plurality of holding members, and horizontally holds a plurality of wafers 200 (e.g., about 50 to 150 wafers) which are arranged in the vertical direction such that centers thereof are aligned with each other.

As shown in FIG. 4, a clean unit 134a is provided above the cassette shelves 105. The clean unit 134a includes a dustproof filter and a supply fan for supplying clean air which is a purified atmosphere so that the clean air flows into the casing 111.

As typically shown in FIG. 4, a clean unit (not shown) comprising a supply fan for supplying clean air and a dustproof filter is provided on a left side of the casing 111, i.e. on the opposite side of the wafer loading device elevator 125b and the boat elevator 115. Clean air belched out from the clean unit (not shown) flows through the wafer loading device 125a and the boat 217, and then is sucked in by an exhaust device (not shown), and is exhausted outside the casing 111.

Next, an operation of the processing apparatus according to the preferred embodiments of the present invention will be explained.

As shown in FIGS. 4 and 5, before the cassette 110 is supplied to the cassette stage 114, the cassette carry in/out opening 112 is opened by the front shutter 113. Then, the cassette 110 is transferred in from the cassette carry in/out opening 112, and is placed on the cassette stage 114 such that the wafers 200 are in their vertical attitudes and the opening of the cassette 110 for taking wafers in and out is directed upward. Then, the cassette 110 is rotated clockwisely in the vertical direction by 90° to rearward of the casing so that the wafers 200 in the cassette 110 are in their horizontal attitudes, and the opening of the cassette 110 for taking wafers in and out is directed to rearward of the casing.

Next, the cassette 110 is automatically transferred onto a designated shelf position of the cassette shelves 105 or the auxiliary cassette shelves 107 by the cassette transfer device 118, and the cassette 110 is temporarily stored. After that, the cassette 110 is transferred onto the transfer shelves 123 from the cassette shelves 105 or the auxiliary cassette shelves 107 by the cassette transfer device 118, or directly transferred onto the transfer shelves 123.

When the cassette 110 is transferred onto the transfer shelves 123, the wafers 200 are picked up from the cassette 110 through the opening by tweezers 125c of the wafer loading device 125a, and the boat 217 located behind a loading chamber 124 is charged with the wafers 200. The wafer loading device 125a which delivered the wafers 200 to the boat 217 returns to the cassette 110, and charges the boat 217 with the next wafers 200.

When the boat 217 is charged with a predetermined number of wafers 200, a lower end of the processing furnace 202 which was closed by the furnace opening shutter 147 is opened by the furnace opening shutter 147. Then, the boat 217 which holds a group of wafers 200 is loaded into the processing furnace 202 by moving the seal cap 219 upward by the boat elevator 115. After the loading, the wafers 200 are subjected to arbitrary processing in the processing furnace 202. After the processing, the wafers 200 and the cassette 110 are carried outside the casing 111 by reversing the above-described procedure.

Next, a processing furnace 202 used in the above-described substrate processing apparatus will be explained with reference to FIGS. 6 and 7.

Figure 6:
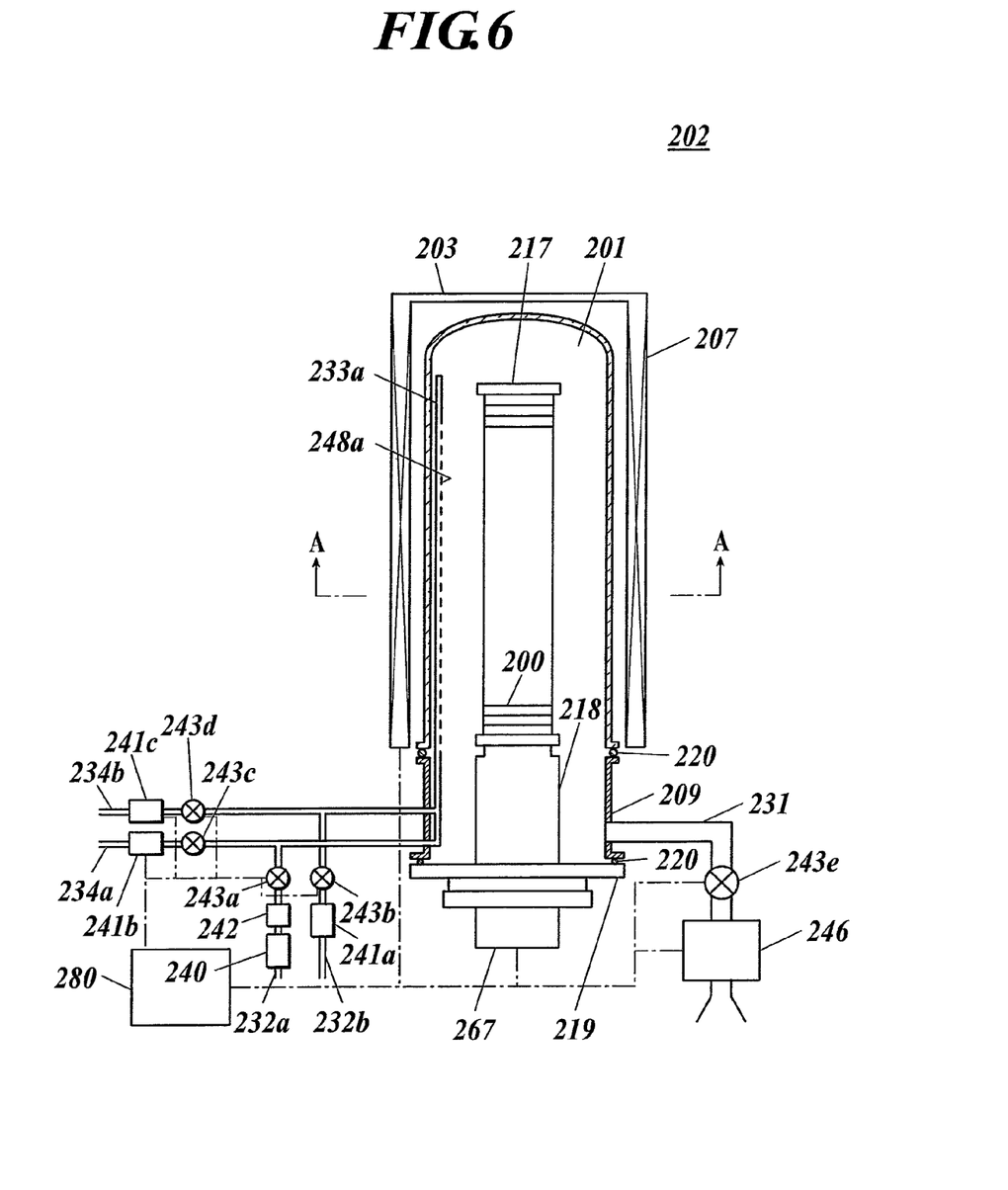
FIG. 6 is a vertical sectional view of a processing furnace used in the substrate processing system according to the embodiments of the present invention.
Figure 7:
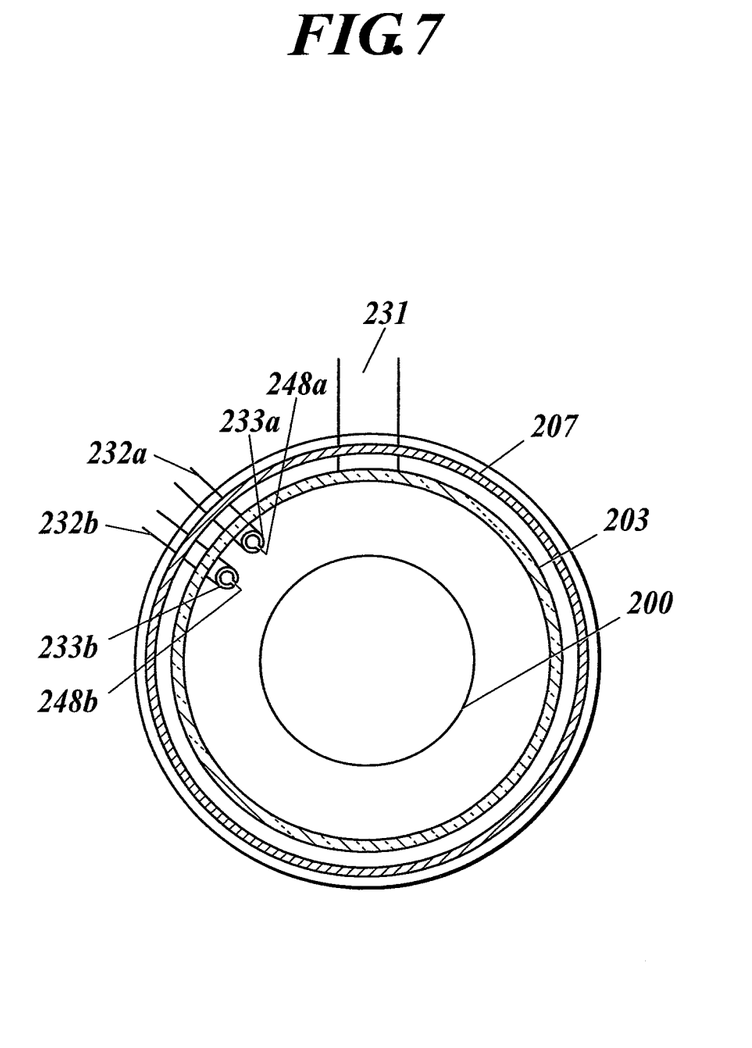
FIG. 7 is an enlarged sectional view taken along the line A-A in FIG. 6.

FIG. 6 is a schematic block diagram of a vertical substrate processing furnace which is preferably used in the preferred embodiments of the present invention, and shows a vertical sectional view of a portion of the processing furnace 202. FIG. 7 is a schematic block diagram of a vertical substrate processing furnace which is preferably used in the embodiments, and shows a sectional view of the portion of the processing furnace 202 taken along the line A-A in FIG. 6.

A reaction tube 203 as a reaction container which processes the wafers 200 as substrates is provided inside a heater 207 which is a heating device (heating means). A manifold 209, which is made of stainless steal etc., is provided at a lower end of the reaction tube 203 through an O-ring 220 which is an air-tight member. A lower end opening of the manifold 209 is air-tightly closed by the seal cap 219 as a lid through an O-ring 220. The processing chamber 201 is formed by at least the reaction tube 203, the manifold 209 and the seal cap 219. The boat 217 which is the substrate holding member (substrate holding means) stands on the seal cap 219 through a boat support stage 218. The boat support stage 218 is a holding body which holds the boat. The boat 217 is inserted into the processing chamber 201. The plurality of wafers 200 which are to be subjected to batch process are stacked on the boat 217 in a horizontal attitude in multi-layers in the axial direction of the tube. The heater 207 heats the wafers 200 inserted into the processing chamber 201 to a predetermined temperature.

Two gas supply tubes (a first gas supply tube 232a, a second gas supply tube 232b) as supply paths extend to the processing chamber 201 for supplying a plurality of kinds of (here, two kinds of) processing gases. A first carrier gas supply tube 234a for supplying carrier gas merges with the first gas supply tube 232a through a liquid mass flow controller 240 which is a flow rate control device (flow rate control means), a vaporizer 242, and a first valve 243a which is an on/off valve in this order from upstream. The carrier gas supply tube 234a is provided with a second mass flow controller 241b which is a flow rate control device (flow rate control means) and a third valve 243c which is an on/off valve in this order from upstream. A tip end of the first gas supply tube 232a is provided with a first nozzle 233a in an arc space between the wafers 200 and an inner wall of the reaction tube 203 constituting the processing chamber 201 along the inner wall from a lower portion of the reaction tube 203 to a higher portion thereof in a stacking direction of the wafers 200. A side of the first nozzle 233a is provided with first gas supply holes 248a which are supply holes for supplying gas. The first gas supply holes 248a have the same opening areas from a lower portion to an upper portion of the nozzle, and distances between adjacent openings are equal to each other.

A second carrier gas supply tube 234b which supplies carrier gas merges with a second gas supply tube 232b through a first mass flow controller 241a which is a flow rate control device (flow rate control means) and a second valve 243b which is an on/off valve in this order from upstream. The carrier gas supply tube 234b is provided with a third mass flow controller 241c which is a flow rate control device (flow rate control means) and a fourth valve 243d which is an on/off valve in this order from upstream. A tip end of the second gas supply tube 232b is provided with a second nozzle 233b in an arc space between the wafers 200 and the inner wall of the reaction tube 203 constituting the processing chamber 201 along the inner wall from a lower portion of the reaction tube 203 to a higher portion thereof in a stacking direction of the wafers 200. Second gas supply holes 248b which are supply holes through which gas is supplied are formed in a side of the second nozzle 233b. The second gas supply holes 248b have the same opening areas from a lower portion to an upper portion of the nozzle 233b, and distances between adjacent openings are equal to each other.

If a material supplied from the first gas supply tube 232a is liquid for example, the first gas supply tube 232a merges with the first carrier gas supply tube 234a through the liquid mass flow controller 240, the vaporizer 242, and the first valve 243a, and reaction gas is supplied into the processing chamber 201 through the nozzle 233a. When a material supplied from the first gas supply tube 232a is gas for example, the liquid mass flow controller 240 is replaced by a mass flow controller for gas, and the vaporizer 242 is not necessary. The second gas supply tube 232b merges with the second carrier gas supply tube 234b through the first mass flow controller 241a and the second valve 243b, and reaction gas is supplied to the processing chamber 201 through the second nozzle 233b.

The processing chamber 201 is connected to a vacuum pump 246 which is an exhaust device (exhaust means) through a fifth valve 243e by a gas exhaust pipe 231 which is an exhaust pipe from which gas is exhausted so that the processing chamber 201 is evacuated. The evacuation of the processing chamber 201 can be carried out or stopped by opening or closing the fifth valve 243e. The valve 243e is an on/off valve which can adjust a pressure by adjusting the valve opening degree.

The boat 217 is provided at a central portion in the reaction tube 203. The plurality of wafers 200 are placed on the boat 217 at equal distances from one another in multi-layers. The boat 217 can come into and go out from the reaction tube 203 by a boat elevator mechanism (not shown). To enhance the processing uniformity, a boat rotating mechanism 267 is provided for rotating the boat 217. The boat 217 supported by the boat support stage 218 is rotated by driving the boat rotating mechanism 267.

A controller 280 which is a control section (control means) is connected to the liquid mass flow controller 240, the first to third mass flow controllers 241a, 241b and 241c, the first to fifth valves 243a, 243b, 243c, 243d and 243e, the heater 207, the vacuum pump 246, the boat rotating mechanism 267 and the boat elevator mechanism (not shown). The controller 280 controls the adjustment of flow rates of the liquid mass flow controller 240 and the first to third mass flow controllers 241a, 241b and 241c, controls opening and closing of the first to fourth valves 243a, 243b, 243c and 243d, controls opening and closing and adjustment of pressure of the fifth valve 243e, controls the adjustment of temperature of the heater 207, controls actuation and stop of the vacuum pump 246, controls the adjustment of rotation speed of the boat rotating mechanism 267, and controls the vertical motion of the boat elevator mechanism.

Next, an example of film forming processing using a processing furnace 202 of the present embodiments will be explained.

In the processing furnace 202 of the present embodiments, a high permittivity film such as $HfO_2$ and $ZrO_2$ is formed. Examples of a material for $HfO_2$ are TEMAH (tetrakis methylethyl amino hafnium, $Hf(NEtMe)_4$), $Hf(O-tBu)_4$, TDMAH (tetrakis dimethyl amino hafnium, $Hf(NMe_2)_4$), TDEAH(tetrakis diethyl amino hafnium, $Hf(NEt_2)_4$), $Hf(MMP)_4$ and the like. Like Hf material, as a material for $ZrO_2$, $Zr(NEtMe)_4$, $Zr(O-tBu)_4$, $Zr(NMe_2)_4$, $Zr(NEt_2)_4$ and the like are used. Here, Me represents methyl ($CH_3$), Et represents ethyl ($C_2H_5$), and $Zr(O-tBu)_4$ represents $Zr(OC(CH_2)_3)_4$.

In addition to the above materials, it is possible to use amine-compound material expressed by chemical formula $X_n(NR^1R^2)_m$, (elements in III to V families, $R^1$ and $R^2$ indicate Me or Et, and n and m indicate natural numbers).

An example of film forming processing using an ALD method will be explained below based on an example for forming an $HfO_2$ film using TEMAH and $O_3$ which is one of producing steps of a semiconductor device.

According to the ALD (Atomic Layer Deposition) method which is one of CVD (Chemical Vapor Deposition) methods, at least two kinds of reaction gases as materials used for forming films are alternately supplied onto substrates under given film forming conditions (temperature, time, etc.), the reaction gas adheres onto the substrates by atom by atom, and films are formed utilizing surface reaction. At that time, the film thickness is controlled based on the number of cycles in which reaction gas is supplied (for example, if the film forming speed is 1 Å/cycle, in order to form a film of 20 Å, 20 cycles are carried out).

According to the ALD method, when the $HfO_2$ films are to be formed for example, high quality films can be formed at a low temperature of 180 to 250° C. using TEMAH and $O_3$.

First, the boat 217 is charged with the wafers 200, and the boat 217 is load into the processing chamber 201 as described above. After that, the following three steps are carried out sequentially.

(Step 1) The TEMAH flows through the first gas supply tube 232a, and carrier gas ($N_2$) flows through the first carrier gas supply tube 234a. At that time, the fifth valve 243e of the gas exhaust tube 231 is kept open. The first valve 243a of the first gas supply tube 232a and the third valve 243c of the first carrier gas supply tube 234a are opened. The carrier gas flows from the first carrier gas supply tube 234a, and a flow rate thereof is adjusted by the second mass flow controller 241b. The TEMAH flows from the first gas supply tube 232a, and a flow rate thereof is adjusted by the liquid mass flow controller 240. Then, the TEMAH is vaporized by the vaporizer 242, mixed with the carrier gas whose flow rate is adjusted, and the mixture is supplied into the processing chamber 201 from the first gas supply holes 248a of the first nozzle 233a while it is exhausted from the gas exhaust pipe 231. At that time, the processing chamber 201 is maintained at pressure in the range of 6.6 to 665 Pa (for example, 300 Pa) by appropriately adjusting the fifth valve 243e. A supply rate of TEMAH controlled by the liquid mass flow controller 240 is 0.01 to 0.5 g/min. The wafers 200 are exposed to the TEMAH gas for 30 to 180 seconds. At that time, the temperature of the heater 207 is set such that the wafer temperature is in a range of 180 to 300° C. (for example, 200° C.). A surface reaction (chemical adsorption) with a surface portion such as an underlayer film on the wafer 200 occurs by supplying the TEMAH into the processing chamber 201.

(Step 2) Next, the first valve 243a of the first gas supply tube 232a is closed, and the supply of TEMAH is stopped. At that time, the fifth valve 243e of the gas exhaust pipe 231 is kept open, the gas is exhausted from the processing chamber 201 to 20 Pa or lower by the vacuum pump 246, and remaining TEMAH gas is exhausted from the processing chamber 201. If inert gas such as $N_2$ or the like is supplied into the processing chamber 201, the effect for eliminating the remaining TEMAH is further enhanced.

(Step 3) Next, $O_3$ flows through the second gas supply tube 232b and carrier gas ($N_2$) flows through the second carrier gas supply tube 234b. The second valve 243b of the second gas supply tube 232b and the fourth valve 243d of the second carrier gas supply tube 234b are opened. The carrier gas flows from the second carrier gas supply tube 234b, and the flow rate thereof is adjusted by the third mass flow controller 241c. The $O_3$ flows from the second gas supply tube 232b, the flow rate thereof is adjusted by the third mass flow controller, the $O_3$ is mixed with the carrier gas whose flow rate is adjusted, and the mixture is supplied into the processing chamber 201 from the second gas supply holes 248b of the second nozzle 233b while it is exhausted from the gas exhaust pipe 231. At that time, the processing chamber 201 is maintained at pressure in the range of 26 to 266 Pa (for example, 66 Pa) by appropriately adjusting the fifth valve 243e. The wafers 200 are exposed to $O_3$ for 10 to 120 seconds. The heater 207 is set such that the temperature of the wafers at that time is in a range of 180 to 300° C. (for example, 200° C.) as in the supply operation of TEMAH gas in step 1. By supplying $O_3$, the $O_3$ and the TEMAH which is chemically adsorbed on the surfaces of the wafers 200 react with each other, and an $HfO_2$ film is formed on each of the wafers 200.

After the films are formed, the second valve 243b of the second gas supply tube 232b and the fourth valve 243d of the second carrier gas supply tubes 234b are closed, the processing chamber 201 is evacuated by the vacuum pump 246, and remaining $O_3$ gas after the film formation is eliminated. If inert gas such as $N_2$ is supplied into the reaction tube 203, the effect for eliminating the remaining $O_3$ gas is enhanced.

The steps 1 to 3 are defined as one cycle, and if this cycle is repeated a plurality of times, $HfO_2$ films having predetermined film thickness can be formed on the wafers 200.

Next, a product deposited in a vaporizing unit shown in FIG. 1 when TEMAH flows into the vaporizing unit will be explained. When the product was subjected to EPMA (electron beam micro analysis), Hf, O, C and N were detected, and it was found that O accounts for 13 to 30% of them. In FT-IR (Fourier transform type infrared absorption spectrum), a peak caused by C—H, C—N, O—H coupling was observed as compared with a hafnium oxide, and it was conceived that organic including amino group remained. From these analysis results, it was expected that the product was a cluster such as $(NmeEt)_n(OH)_mHfO_1$. It was found that this product does not dissolve in N-hexane used as a cleaning solvent for a pipe.

The present inventors considered that a product such as $(NMeEt)_n(OH)_mHfO_1$ does not dissolve in an aprotic solvent having no polarity such as N-hexane, but the product dissolves, reacts with or decomposed in protic solvent.

The above-described product $(NMeEt)_n(OH)_mHfO_1$ forms a cluster by ion binding. In order to break the ionic compound bond, if it is brought into contact with a solvent which is prone to be ionized, it is decomposed and the product cluster can be separated into molecules. Here, the solvent which is prone to be ionized is a protic solvent. If the solvent is easily ionized and reacts with $(NMeEt)_n(OH)_mHfO_1$ which forms an ion cluster by a proton elimination, the product ion is brought into a solvate state surrounded by an ion of solvent molecules, and the product cluster can be separated into molecules.

Here, the protic solvent is an alcohol solvent such as methyl alcohol and ethyl alcohol. The aprotic solvent having no polarity is a hydrocarbon-compound solvent such as octane and hexane.

An outline of cleaning procedure in the vaporizer 242 is as follows:

Here, hexane is used as an aprotic solvent, and methanol is used as a protic solvent, for example.

(1) First, hexane which is an aprotic solvent is supplied to the vaporizing unit. In this step, hexane permeates into the product cluster without reacting with the product cluster.

(2) Next, methanol which is a protic solvent is supplied without discharging the hexane from the vaporizing unit. In this step, the product cluster reacts with methanol and is decomposed to generate amine.

In this step, it is preferable that hexane is not discharged. This is because that since the hexane has high volatility, if the hexane is discharged, the hexane which permeates into the product cluster is also volatized, and if methanol is supplied in this state, the product cluster turns into a gel. If the discharging time of hexane is sufficiently short, an effect to some extent can be expected even if hexane is discharged, but it is more preferable that hexane is not discharged.

Molecules of the cluster decomposed by the methanol dissolve in hexane.

(3) The solvent is discharged from the vaporizing unit.

(4) Preferably, hexane is supplied thereafter and discharged. This is because that it is easier to discharge hexane which is a non-polarity solvent from the vaporizing unit than to discharge methanol which is a polarity solvent from the vaporizing unit (it is possible to easily discharge only by evacuation).

To remove the product in the vaporizing unit more reliably, the steps (1) to (3) may be repeated a plurality of times.

In the step (1), if methanol which is a protic solvent is first supplied into the vaporizing unit instead of hexane, the product cluster turns into a gel having poor solubility (Hf—O—Hf is formed). If hexane is added in this state, it is difficult to remove (dissolve) the product.

Therefore, if hexane is supplied first, the following two effects can mainly be obtained.

First, if methanol is supplied first (without hexane), heat is generated, condensation reaction occurs and gelatinization occurs. Hence, this can be prevented if hexane is supplied first.

Second, if hexane permeates into the product cluster (or the vaporizing unit is filled with hexane), methanol which is supplied next can uniformly enter the product cluster, and the methanol and the product cluster can uniformly react with each other.

That is, if hexane is supplied into the vaporizing unit prior to methanol, and the hexane and the methanol act on the product cluster, it is possible to make the product cluster react and to decompose the product cluster. As a result, the product cluster can easily be removed from the vaporizing unit.

It is conceived that reaction between a product cluster and methanol in the vaporizing unit when TEMAH is used can be expressed by the following formula:

wherein, $(MeO)_n(OH)_mHfO_1$ is hexane soluble, and HNMeEt is an amine gas.

Figure 2:
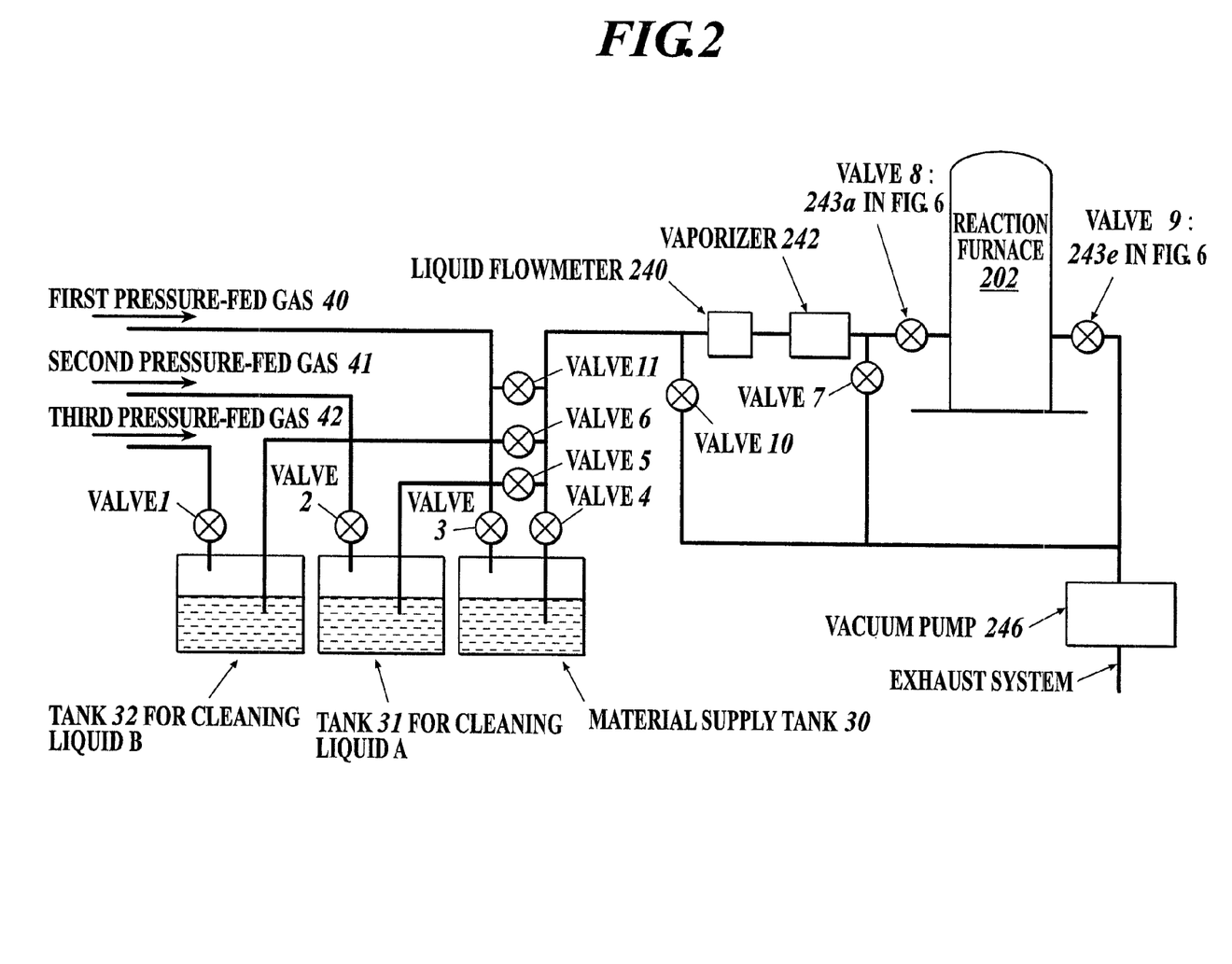
FIG. 2 is a schematic configuration diagram of the substrate processing system according to the embodiments of the present invention.

Next, FIG. 2 shows a schematic configuration of the substrate processing system of the present embodiments. A material in a liquid material tank 30 is sent to the vaporizer 242 by a first pressure-fed gas 40 through a liquid flowmeter 240. After the material is vaporized by the vaporizer 242, the material is supplied to the processing furnace 202 to contribute to film formation. A material supply system of a normal substrate processing system includes the material tank 30, the liquid flowmeter 240, the vaporizer 242 and the processing furnace 202. The substrate processing system of the present embodiments further includes a cleaning liquid tank 31 which accommodates a cleaning liquid A therein, and a cleaning liquid tank 32 which accommodates a cleaning liquid B therein.

If a by-product is deposited in the vaporizer by forming films during a constant period, the vaporizer is supposed to be cleaned using the cleaning liquid tanks 31 and 32. After the liquid material remaining in the pipe is exhausted through a valve 10 and an exhaust pump 246, a cleaning liquid A is sent into the vaporizer 242 using a second pressure-fed gas 41.

After permeating the cleaning liquid A into the by-product for a constant time, the cleaning liquid B is sent into the vaporizer 242 by a third pressure-fed gas 42. With this, the product easily reacts with and is decomposed by the cleaning liquid B.

Figure 3:
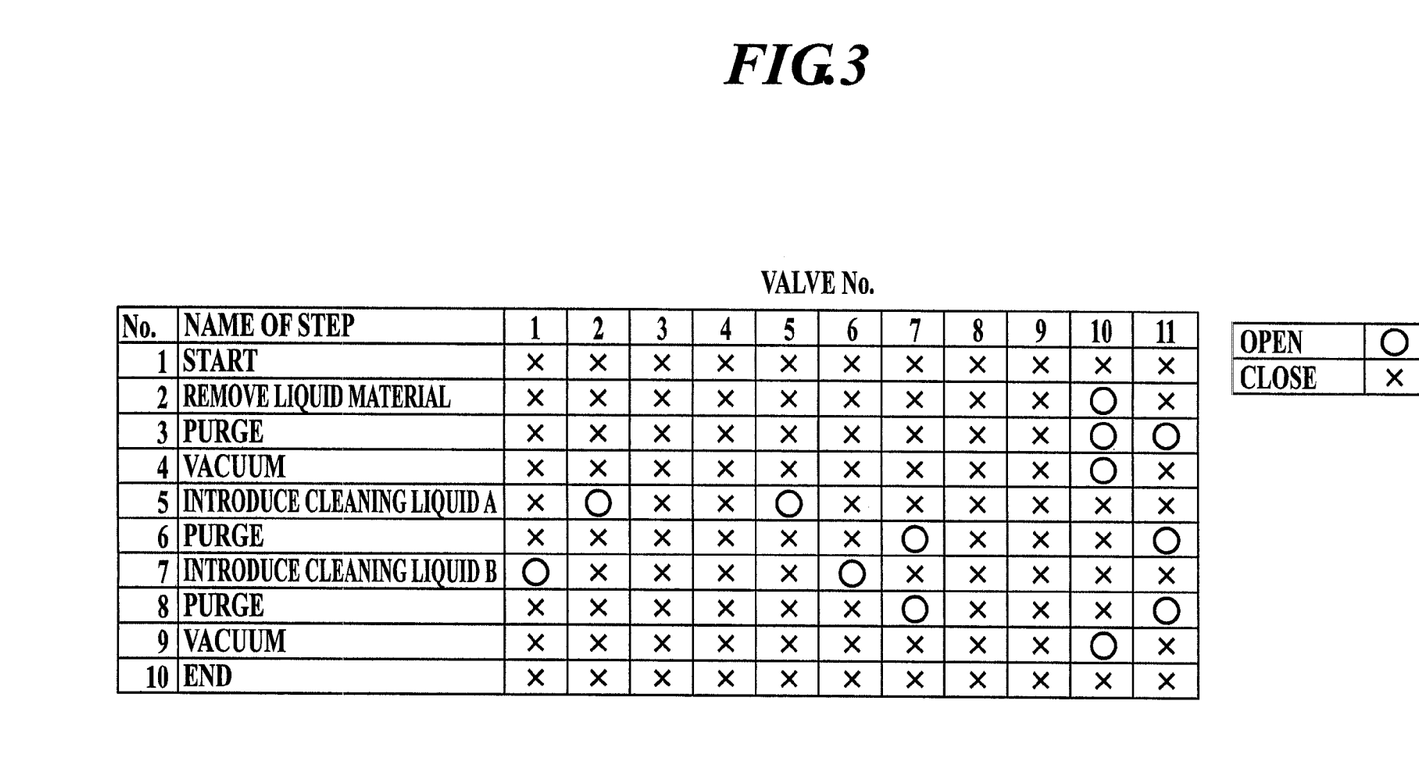
FIG. 3 is a diagram showing cleaning sequence in the substrate processing system according to the embodiments of the present invention.

FIG. 3 shows one example of cleaning sequence.

As the cleaning sequence, the valve 10 is first opened, and then the liquid material remaining in the pipe is exhausted by the exhaust pump 246. Then, a valve 11 is opened, and then an inside of the pipe is purged with the first pressure-fed gas 40. Next, the valve 11 is closed, and then the pipe is evacuated to vacuum for introducing the cleaning liquid A. Then, the valve 10 is closed, the valves 2 and 5 are opened, and the cleaning liquid A is introduced into the vaporizer by the action of the second pressure-fed gas 41. Here, the cleaning liquid A permeates into the product in the pipe and the vaporizing unit. After the cleaning liquid A is supplied for a predetermined time, the valves 2 and 5 are closed, and the valves 7 and 11 are opened to remove the cleaning liquid A. As described above, if the cleaning liquid A has high volatility, it is preferable that the cleaning liquid A is not removed or discharged. Then, the valves 7 and 11 are closed, and the valves 1 and 6 are opened to introduce the cleaning liquid B. After a predetermined time has elapsed, the valves 1 and 6 are closed, and the valves 7 and 11 are opened to remove the cleaning liquid B. At that time, the product is also discharged at the same time. Then, the valves 7 and 11 are closed, the valve 10 is opened, and the evacuation is carried out.

By executing the above-described procedure, the product can be removed.

The above-described cleaning sequence is executed by controlling operations of the valves by a controller 280.

As explained above, according to the preferred embodiments of the present invention, there is provided a substrate processing system, comprising:

a processing chamber to process a substrate;

a vaporizing unit to vaporize a material of liquid;

a supply system to supply the processing chamber with gas of the material vaporized by the vaporizing unit;

an exhaust system to exhaust an atmosphere in the processing chamber; and a cleaning liquid supply system to supply the vaporizing unit with cleaning liquid for cleaning a product deposited in the vaporizing unit, wherein the cleaning liquid supply system supplies at least two kinds of cleaning liquids into the vaporizing unit so that the product can be removed from the vaporizing unit by action of the two kinds of cleaning liquids on the product.

According to the preferred embodiments of the present invention, it is possible to prevent particles (dust) from increasing, and to extend a maintenance interval of piping, a valve and the like by removing a by-product generated by decomposition of raw material.

Moreover, it is possible to save considerable expense (member costs and labor costs) which is required for maintenance of a piping system. Furthermore, generation of particles (dust) due to decomposed matter and clogging of pipes can be prevented, and it is possible to remarkably extend the maintenance interval of the piping system. Therefore, it is possible to prevent an availability factor of the apparatus from being deteriorated.

Preferably, the cleaning liquids include a first cleaning liquid and a second cleaning liquid, the first cleaning liquid is an aprotic solvent, the second cleaning liquid is a protic solvent, and supply order of the cleaning liquids is set such that the second cleaning liquid is supplied to the vaporizing unit after the first cleaning liquid is supplied to the vaporizing unit.

Preferably, the second cleaning liquid is supplied to the vaporizing unit with the first cleaning liquid remained in the vaporizing unit.

Preferably, after the first cleaning liquid and the second cleaning liquid are discharged from the vaporizing unit, the first cleaning liquid is again supplied to the vaporizing unit.

Preferably, the first cleaning liquid permeates into the product by supplying the first cleaning liquid to the vaporizing unit and then, the second cleaning liquid reacts with the product and decomposes the product by supplying the second cleaning liquid.

Preferably, the first cleaning liquid is an aprotic solvent, and more preferably, is a hydrocarbon-compound solvent.

Preferably, the second cleaning liquid is a protic solvent, and more preferably, is an alcohol-compound solvent.

According to the other preferred embodiments of the present invention, there is provided a cleaning method of a vaporizing unit in a substrate processing system, the system comprising:

a processing chamber to process a substrate;

a vaporizing unit to vaporize a liquid material;

a supply system to supply the processing chamber with a material gas vaporized by the vaporizing unit;

an exhaust system to exhaust an atmosphere in the processing chamber; and a cleaning liquid supply system to supply the vaporizing unit with cleaning liquid for cleaning a product deposited in the vaporizing unit, wherein the cleaning liquid supply system supplies at least two kinds of cleaning liquids into the vaporizing unit so that the product can be removed from the vaporizing unit by action of the two kinds of cleaning liquids on the product.

The entire disclosures of Japanese Patent Application No. 2006-015295 filed on Jan. 24, 2006 and Japanese Patent Application No. 2006-255635 filed on Sep. 21, 2006 each including specification, claims, drawings and abstract are incorporated herein by reference in their entireties.

Although various exemplary embodiments have been shown and described, the invention is not limited to the embodiments shown. Therefore, the scope of the invention is intended to be limited solely by the scope of the claims that follow.

As explained above, according to the preferred embodiments of the present invention, it is possible to prevent particles (dust) from increasing, and to extend a maintenance interval of piping, a valve and the like by removing a by-product generated by decomposition of raw material. As a result, the present invention can especially suitably be utilized for a substrate processing system having a vaporizing unit for vaporizing a liquid material.

What is claimed is:

1. A cleaning method for a vaporizing unit to remove a product deposited in the vaporizing unit, the method comprising the steps in the sequence set forth:
    supplying a first cleaning liquid which is an aprotic solvent to the vaporizing unit deposited with the product;
    supplying a second cleaning liquid which is a protic solvent to the vaporizing unit with the first cleaning liquid remained in the vaporizing unit;
    discharging the first cleaning liquid and the second cleaning liquid from the vaporizing unit; and
    supplying the first cleaning liquid to the vaporizing unit.

2. The cleaning method for a vaporizing unit according to claim 1, wherein the first cleaning liquid is a hydrocarbon-compound solvent.

3. The cleaning method for a vaporizing unit according to claim 1, wherein the second cleaning liquid is an alcohol-compound solvent.

* * * * *